United States Patent
Damjanovic et al.

(10) Patent No.: US 9,437,760 B2
(45) Date of Patent: Sep. 6, 2016

(54) METHOD OF REDUCING SEMICONDUCTOR WINDOW LAYER LOSS DURING THIN FILM PHOTOVOLTAIC DEVICE FABRICATION, AND RESULTING DEVICE STRUCTURE

(71) Applicant: FIRST SOLAR, INC., Perrysburg, OH (US)

(72) Inventors: Daniel Damjanovic, Perrysburg, OH (US); Rick C. Powell, Ann Arbor, MI (US); Jigish Trivedi, Perrysburg, OH (US); Zhibo Zhao, Novi, MI (US)

(73) Assignee: FIRST SOLAR, INC., Perryburg, OH (US)

( * ) Notice: Subject to any disclaimer, the term of this patent is extended or adjusted under 35 U.S.C. 154(b) by 253 days.

(21) Appl. No.: 14/209,589

(22) Filed: Mar. 13, 2014

(65) Prior Publication Data

US 2014/0261687 A1    Sep. 18, 2014

Related U.S. Application Data

(60) Provisional application No. 61/789,650, filed on Mar. 15, 2013.

(51) Int. Cl.
| | |
|---|---|
| *H01L 21/00* | (2006.01) |
| *H01L 31/0296* | (2006.01) |
| *H01L 31/18* | (2006.01) |
| *H01L 21/02* | (2006.01) |

(Continued)

(52) U.S. Cl.
CPC ..... *H01L 31/0296* (2013.01); *H01L 21/02568* (2013.01); *H01L 21/02631* (2013.01); *H01L 31/02966* (2013.01); *H01L 31/03925* (2013.01); *H01L 31/073* (2013.01); *H01L 31/1828* (2013.01); *H01L 31/1832* (2013.01); *Y02E 10/543* (2013.01); *Y02P 70/521* (2015.11)

(58) Field of Classification Search
CPC ........... H01L 31/1832; H01L 31/1828; H01L 31/073; H01L 31/08925; H01L 31/02966; H01L 31/0296; H01L 21/02631; H01L 21/02568
USPC .................................. 438/24, 84, 85, 86, 98
See application file for complete search history.

(56) References Cited

U.S. PATENT DOCUMENTS

| | | |
|---|---|---|
| 4,069,356 A | 1/1978 | Fischer |
| 5,248,349 A | 9/1993 | Foote et al. |
| 5,261,968 A | 11/1993 | Jordan |

(Continued)

FOREIGN PATENT DOCUMENTS

| | | |
|---|---|---|
| EP | 2333844 | 6/2011 |
| WO | WO 2011049933 | 4/2011 |
| WO | WO 2011126454 | 10/2011 |

OTHER PUBLICATIONS

Joel N. Duenow, et al., "CdS/CdTe Solar Cells Containing Directly Deposited $CdS_xTe_{1-x}$ Alloy Layers", Conference Paper, NREL/CP-5200-50755, Jul. 2011.

A.D. Compaan, et al., "Critical Issues and Research Needs for CdTe-Based Solar Cells", htttt://www.udel.edu/iec/Resumes/Birkmire/Pubs/RwB90.pdf, Pub. 1999.

(Continued)

*Primary Examiner* — Long K Tran
(74) *Attorney, Agent, or Firm* — Blank Rome LLP (57) ABSTRACT

A completed photovoltaic device and method forming it are described in which fluxing of a window layer into an absorber layer is mitigated by the presence of a sacrificial fluxing layer.

26 Claims, 4 Drawing Sheets

(51) Int. Cl.
*H01L 31/0392* (2006.01)
*H01L 31/073* (2012.01)

(56) References Cited

U.S. PATENT DOCUMENTS

| | | | |
|---|---|---|---|
| 5,578,502 | A | 11/1996 | Albright et al. |
| 5,945,163 | A | 8/1999 | Powell et al. |
| 7,939,363 | B1 | 5/2011 | Johnson et al. |
| 8,039,290 | B2 | 10/2011 | Feldman-Peabody et al. |
| 2009/0242029 | A1* | 10/2009 | Paulson .............. C23C 14/0629 136/260 |
| 2010/0003781 | A1* | 1/2010 | Van Duren ......... H01L 31/1884 438/98 |
| 2010/0273287 | A1 | 10/2010 | Weiner et al. |
| 2011/0088768 | A1 | 4/2011 | Gloeckler et al. |
| 2011/0120373 | A1 | 5/2011 | Bollman et al. |
| 2011/0139240 | A1 | 6/2011 | Allenic et al. |
| 2011/0139247 | A1 | 6/2011 | Feldman-Peabody |
| 2011/0143492 | A1 | 6/2011 | DeLuca et al. |
| 2011/0162696 | A1* | 7/2011 | Vlcek ............. H01L 31/022425 136/255 |
| 2011/0240123 | A1 | 10/2011 | Lin et al. |
| 2011/0259418 | A1* | 10/2011 | Hollars ............... C23C 14/0057 136/256 |
| 2011/0259424 | A1 | 10/2011 | Basol |
| 2011/0265874 | A1 | 11/2011 | Gossman et al. |
| 2011/0269261 | A1 | 11/2011 | Drayton et al. |
| 2011/0290308 | A1 | 12/2011 | Korevaar |
| 2012/0024380 | A1 | 2/2012 | Feldman-Peabody et al. |
| 2012/0052620 | A1 | 3/2012 | Feldman-Peabody et al. |
| 2012/0052621 | A1 | 3/2012 | Feldman-Peabody et al. |
| 2012/0098032 | A1* | 4/2012 | Guo ................. H01L 21/02568 257/184 |

OTHER PUBLICATIONS

M.A. Santana-Aranda, et al., "Screen printed $CdS_x Te_{1-x}$ films, structural and optical characterization", Applied Surface Science 175-176 (2001) p. 538-542.

M.A. Matin, et al., "Prospects of novel front and back contacts for high efficiency cadmium telluride thin film solar cells from numerical analysis", Solar Energy Materials and Solar Cells, vol. 94, Issue 9, Sep. 2010.

R. Radojcic, et al., "Preparation and Properties of Graded Band Gap $CdS_x Te_{1-x}$ Thin Film Solar Cells", Solar Cells, 4 (1981) p. 121-126.

D.W. Lane, "A review of the optical band gap of thin film $CdS_x Te_{1-x}$", Solar Energy Materials and Solar Cells 90 (2006) p. 1169-1175.

D.A. Wood, et al., "Optical and structural characterizationof $CdS_xTe_{1-x}$ thin films for solar cell applications", Journal of Physics: Condensed Matter, Volumer 12, No. 19.

R.S. Singh, et al., "Nano-structure CdTe, Cds and $TiO_2$ for thin film solar cell applications", Solar Energy Materials and Cells 82 (2004), p. 315-330.

Brian E. McCandless, et al., "Influence of Window and Absorber Layer Processing on Device Operation in Superstrate Thin Film CDTE Solar Cells", IEEE 2000, pp. 491-494.

Victor Plotnikov, "Fabrication of ultra thin CdS/CdTe solar cells by magnetron sputtering", The University of Toledo, Aug. 2009.

Bosio et al., "Polycrystalline CdTe thin films for photovoltaic applications", Progress in Crystal Growth and Characterization of Materials, vol. 52, pp. 247-279, (2006).

B. E. McCandless et al., "Processing options for CdTe thin film solar cells", Solar Energy, vol. 77, pp. 839-856, (2004).

B. E. McCandless et al., "Cadmium Telluride Solar Cells", Handbook of Photovoltaic Science and Engineering, Second Edition, pp. 600-640, Dec. 21, 2010.

* cited by examiner

METHOD OF REDUCING SEMICONDUCTOR WINDOW LAYER LOSS DURING THIN FILM PHOTOVOLTAIC DEVICE FABRICATION, AND RESULTING DEVICE STRUCTURE

CROSS-REFERENCE TO RELATED APPLICATION

This application claims priority to U.S. Provisional Application No. 61/789,650, filed on Mar. 15, 2013, which is hereby fully incorporated by reference.

BACKGROUND OF THE INVENTION

Photovoltaic (PV) devices are PV cells or PV modules containing a plurality of PV cells or any device that converts photo-radiation or light into electricity. Generally, a thin film PV device includes two conductive electrodes sandwiching a series of semiconductor layers. The semiconductor layers include an n-type window layer in close proximity to a p-type absorber layer to form a p-n junction. During operation, light passes through the window layer, and is absorbed by the absorber layer. The absorber layer produces photo-generated electron-hole pairs, the movement of which, promoted by an electric field generated at the p-n junction, produces electric current that can be output through the two electrodes.

Since light has to pass through the window layer to be converted to electricity, it is desirable to have a thin window layer that allows the most amount of light to pass therethrough. The more light that passes through the window layer, the more efficient the device. Thus, one method that has been used to increase device photo-conversion efficiency is to use a window layer that is as thin as possible, while maintaining the p-n junction with the absorber layer.

Another method that has been used to enhance device photo-conversion efficiency is to subject the absorber layer to a cadmium chloride ($CdCl_2$) activation treatment. Alternative compounds for the activation treatment can also be used such as, for example, $NHCl_2$, $ZnCl_2$, $TeCl_2$, or other halide salts.

The $CdCl_2$ activation treatment increases the grain size and reduces defect areas in the absorber layer. Specifically, one factor that may limit thin-film photo-conversion efficiency is the number of photo-generated electron-hole pairs (i.e., carriers) that are trapped and then recombined before they are output as electricity by the device. In some instances, carriers may get trapped at structural defects such as defective grain boundaries within various layers of the device. For example, the semiconductor absorber layer is formed of grains, also known as crystallites. Crystallites are small, microscopic crystals, where the orientation of the crystal lattice within the crystallite is the same. But, a defect exists where the orientation of the crystal lattice changes from one grain to another. Hence, the crystallites that make up the absorber layer may be said to have defective grain boundaries where crystallites on each side of the boundary are identical, except in crystal orientation.

In any case, the larger the grains that make up the absorber layer, the lesser the number of grain boundaries present in the absorber layer. Thus, the $CdCl_2$ activation treatment increases the size of the grains or crystals that make up the absorber layer and thus reduces the number of grain boundaries available to trap carriers. Device efficiency may thus be enhanced.

For example, a thin-film PV device may have a window layer formed of cadmium sulfide (CdS) and an absorber layer formed of cadmium telluride (CdTe). The $CdCl_2$ activation treatment includes applying $CdCl_2$, for example, in liquid or vapor form, to the CdTe of the absorber layer, and then annealing the absorber layer at a particular anneal temperature, for example about 400° C. to about 420° C., for a particular anneal time, for example, from about 10 minutes to about one hour. The anneal temperature is generally high enough and the anneal time long enough to promote recrystallization of the CdTe crystallites.

The recrystallization of the cadmium telluride can take two forms or a combination of the following two forms: (1) intragrain or primary recrystallization (recrystallization that changes crystallite grain orientation); and (2) intergrain or secondary recrystallization (recrystallization resulting from grain coalescence).

The primary crystallization leads to adjacent grains, which were oriented differently, to now be oriented in the same direction. Hence, primary crystallization results in a lesser number of defective boundaries being available to trap carriers therein. By contrast, the secondary recrystallization results in grain growth as smaller grains coalesce into larger ones. Thus, it too, leads to a reduced number of grain boundaries, which could contain defects.

Further, in addition to reducing the number of defective grain boundaries in the absorber layer, the $CdCl_2$ activation treatment also repairs some of the defects in the grain boundaries. This is done through the incorporation of chlorine atoms (or ions) from the $CdCl_2$ into the CdTe absorber layer. Other mechanisms believed to repair or passivate such defects include the formation of doping complexes within the absorber layer created by cadmium vacancies, the incorporation of chlorine atoms to occupy tellurium sites, and inter-diffusion of materials between the absorber layer and the semiconductor window layer.

The $CdCl_2$ and the heat from the $CdCl_2$ activation treatment, while being beneficial in reducing the number of defective grain boundaries in the absorber layer may also promote chemical fluxing. Fluxing occurs when a chemical element from one layer of a photovoltaic device under fabrication, where it is in high concentration, flows into another layer where there is a low concentration, or where it is not.

In this case, the $CdCl_2$ activation treatment may increase the mobility of sulfur atoms from a CdS window layer causing it to diffuse into a CdTe absorber layer. This fluxing of sulfur can consume the CdS in the window layer, overly thinning the layer and, in extreme situations, entirely removing it in some areas resulting in areas where the p-n junction is degraded or lost. The total removal of the CdS window layer may be exacerbated in devices where a very thin window layer was initially used to enhance device efficiency.

It would be desirable, therefore, to provide a technique for reducing or controlling the amount of sulfur fluxing from the window layer into the absorber layer during a $CdCl_2$ activation treatment.

DETAILED DESCRIPTION OF THE INVENTION

Embodiments described herein provide a method of forming PV devices having a sulfur containing window layer, e.g. CdS, and an absorber layer, e.g. CdTe. The method includes forming an additional layer containing sulfur near or within an absorber layer of the device. The sulfur in the additional layer is used to minimize or control fluxing of sulfur from the window layer to the absorber layer during a $CdCl_2$ activation treatment. This will allow a sufficient p-n junction to be maintained in the completed PV devices. Since the additional layer is used for the sole purpose of providing sulfur to the absorber layer during a $CdCl_2$ activation treatment and since it may be consumed entirely during such treatments without any ill effect to the devices, it will henceforth be referred to as a sacrificial layer.

For illustrative purposes, embodiments are described below with reference to a thin film PV device, which may include a PV cell, a collection of cells forming a module, or any portion or combination thereof. However, it should be understood that the embodiments may apply to devices other than thin film devices.

Figure 1:
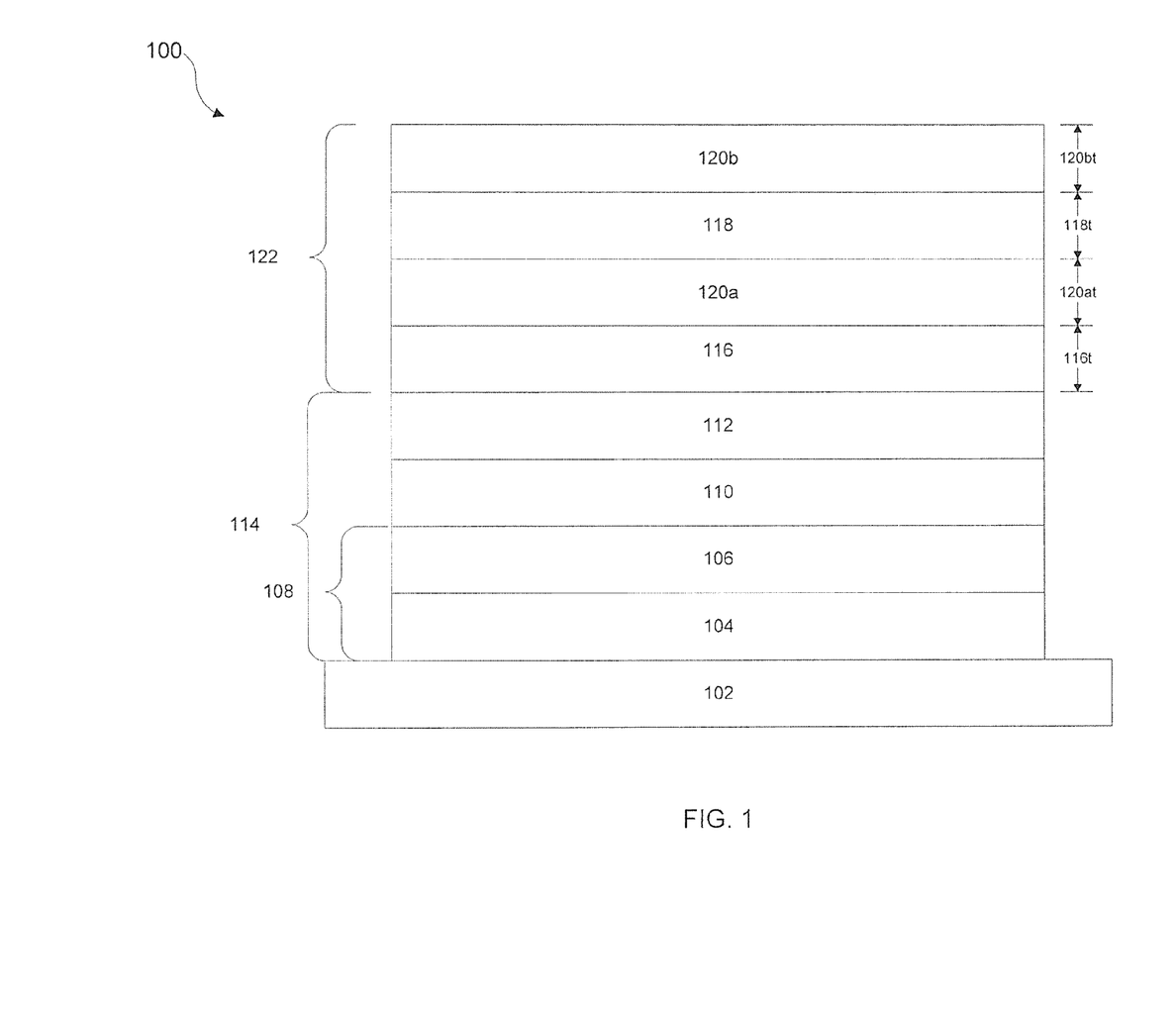
FIG. 1 shows a side view of an intermediate photovoltaic device in accordance with a disclosed embodiment.

Now referring to the accompanying figures, wherein like reference numbers denote like features, FIG. 1 illustrates an exemplary PV device 100 undergoing fabrication. The PV device 100 includes a transparent substrate 102 upon which a transparent conductive oxide (TCO) stack 114, a semiconductor window layer 116, a first absorber layer 120a, a sacrificial layer 118 and a second absorber layer 120b may respectively be formed.

The substrate 102 is used to protect the PV device 100 from environmental hazards. Since the substrate 102 receives light incident on the PV device 100, it should be made of a transparent material. In this case glass or any other suitable material may be used, such as borosilicate glass, soda lime glass, float glass, or polymer.

TCO stack 114 includes an optional barrier layer 108, TCO layer 110, and an optional buffer layer 112. The TCO stack 114 may be pre-formed on substrate 102 and the pre-formed TCO stack 114 on substrate 102 may be purchased from a commercial supplier. Alternatively, the TCO stack 114 may be formed one layer at a time over substrate 102 during fabrication of device 100. In any case, the barrier layer 108 is used to inhibit sodium diffusion from the substrate 102 into other layers (i.e., the window and absorber layers) of the device. Sodium diffusion into these layers may adversely affect device efficiency. The barrier layer 108 can be a bi-layer of an $SnO_2$ layer 104 over the substrate 102 and an $SiO_2$ layer 106 over the $SnO_2$ layer 104 or a single layer of $SiO_2$ or $SnO_2$.

The TCO layer 110 functions as one of the two output electrodes of the device. Since light has to pass through the TCO layer 110 to reach the semiconductor layers where it is converted to electricity, it may be made of a transparent conductive material such as indium tin oxide (ITO), fluorine doped tin oxide ($SnO_2$:F), or cadmium stannate ($Cd_2SnO_4$).

The buffer layer 112, may be used to provide a smooth layer upon which the window layer 116 may be deposited. The smoother the layer upon which the window layer 116 is deposited, the thinner the window layer 116 may be without compromising the p-n junction. The buffer layer 112 may be made of a metal oxide such as $SnO_2$, ZnO, or a combination of ZnO and $SnO_2$.

Over the TCO stack 114, a semiconductor multi-layer 122 is provided that includes an n-type window layer 116, a p-type absorber layer 120a, a sacrificial layer 118 and a second p-type absorber layer 120b. Those layers are described in more detail below.

The semiconductor window layer 116 of thickness 116t is formed adjacent to TCO stack 114. Semiconductor window layer 116 is preferably formed of cadmium sulfide. However, it should be understood that other n-type semiconductors may be used including, but not limited, to cadmium zinc sulfide. Window layer thickness 116t may be greater than about 50 Å. Generally, the window layer thickness 116t can be between about 50 Å and about 2000 Å, between about 100 Å and about 2000 Å, between about 75 Å and about 1000 Å, or greater than 0 Å and less than about 200 Å.

The first semiconductor absorber layer 120a of thickness 120at is formed adjacent to semiconductor window layer 116. First absorber layer 120a is a p-type semiconductor that may be made of cadmium telluride. However it should be understood that other p-type semiconductors may be used. First absorber layer thickness 120at may be greater than about 10 Å. For example, the thickness of the first absorber layer 120a may be between about 10 Å and about 50,000 Å, between about 10,000 Å and about 50,000 Å, between about 10,000 Å and about 30,000 Å, or between about 15,000 Å and about 25,000 Å.

The sacrificial layer 118 of thickness 118t is formed adjacent to first absorber layer 120a. Sacrificial layer 118 preferably includes the same material as semiconductor window layer 116, as discussed further below. Thus, in the present embodiment, sacrificial layer may be made of cadmium sulfide or cadmium zinc sulfide. Sacrificial layer thickness 118t may be greater than about 50 Å. Specifically, it may be between about 50 Å and about 1000 Å, between about 100 Å and about 1000 Å, between about 100 Å and about 800 Å, or between about 400 Å and about 600 Å.

The second semiconductor absorber layer 120b of thickness 120bt is formed adjacent to sacrificial layer 118. Second absorber layer 120b is a p-type semiconductor of the same material as first absorber layer 120a (e.g., cadmium telluride). However, it should be understood that other p-type semiconductors may be used, including materials different than first absorber layer 120a materials. Second absorber layer thickness 120bt may be greater than about 500 Å. That is, the thickness of the second absorber layer 120b may be between about 500 Å and about 50,000 Å, between about 10,000 Å and about 50,000 Å, between about 10,000 Å and about 40,000 Å, or between about 20,000 Å and about 30,000 Å.

The layers of the PV device 100 may be formed using any known deposition technique or combination of techniques. For example, the layers can be formed by chemical vapor deposition (CVD), physical vapor deposition (PVD), chemical bath deposition (CBD), low pressure chemical vapor deposition, atmospheric pressure chemical vapor deposition, plasma-enhanced chemical vapor deposition, thermal chemical vapor deposition, DC or AC sputtering, spin-on deposition, spray-pyrolysis, vapor transport deposition (VTD), closed space sublimation (CSS), as some examples, or a combination thereof. These processes are well known in the industry and thus will not herein be described in detail.

Figure 2A:
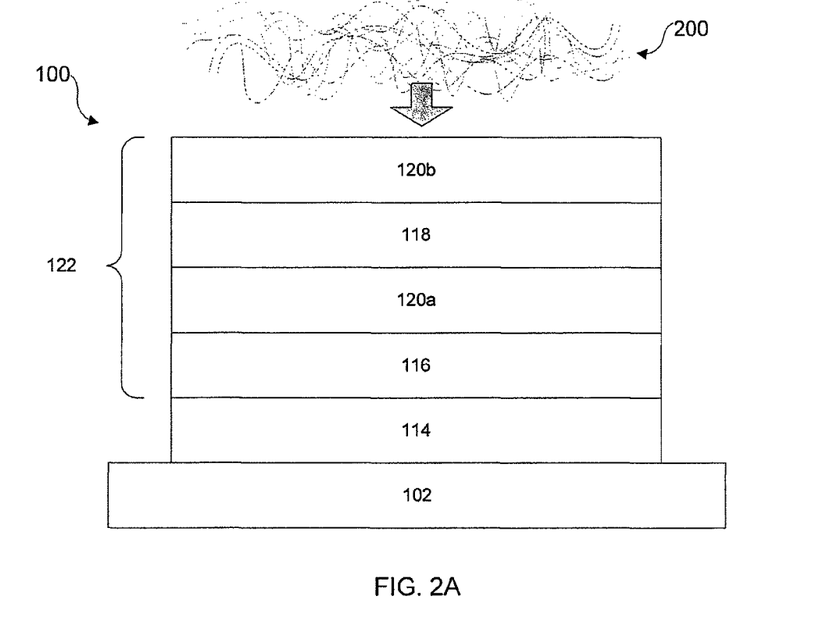
FIGS. 2A and 2B show a side view of a photovoltaic device at various stages of manufacture in accordance with a disclosed embodiment.
Figure 2B:
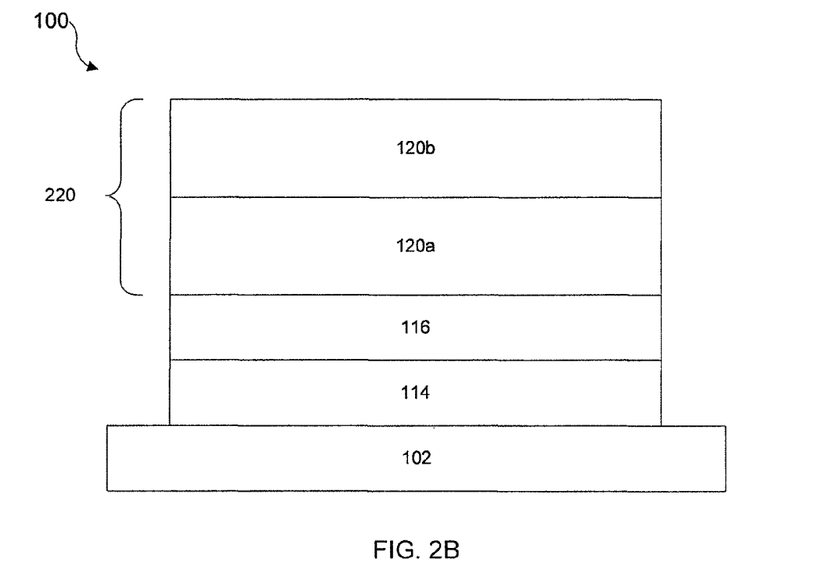

Referring to FIGS. 2A and 2B, after the second absorber layer 120b is deposited, a $CdCl_2$ 200 activation treatment may ensue. As noted earlier, during the $CdCl_2$ activation treatment, the chlorine compound and the associated heat treatment increase sulfur mobility in the window layer 116 and, in the case of the present embodiment, in the sacrificial layer 118 as well, causing the sulfur to be more easily fluxed, e.g. dissolved into absorber layers 120a and 120b.

As noted above, if the sacrificial layer 118 is not used, then during the $CdCl_2$ activation treatment the sulfur in the semiconductor window layer 116 could dissolve into the adjacent absorber layer 120 until either the sulfur solubility limit of the absorber layer 120 is reached, there is no more sulfur left in the window layer 116, or the activation treatment is concluded. The sulfur solubility limit refers to the maximum amount of sulfur that can be dissolved into the absorber layer 120 for a given activation treatment condition. If the sulfur solubility limit of the absorber layer is reached before the CdS of the window layer 116 is degraded, there may remain a p-n junction between the window layer and the absorber layer. But, if the sulfur solubility limit of the absorber layer is not reached before the CdS of the window layer 116 is consumed, then the window layer or portions of the window layer may disappear altogether, eliminating or severely degrading the p-n junction.

By providing the sacrificial layer 118 between the first and the second absorber layers 120a, 120b, sulfur from the window layer 116 may not be used, and if used, may be used in a lesser or controlled amount than if the sacrificial layer 118 was not present in the device during the $CdCl_2$ activation treatment. As a result, it is possible to use more aggressive $CdCl_2$ activation treatment conditions (e.g., higher chlorine concentration, higher annealing temperature, and/or for a longer period of time) without compromising the p-n junction of the device 100. Because PV device 100 may be subjected to more aggressive $CdCl_2$ activation treatment conditions, grain boundaries and defects within the absorber layers 120a, 120b may be further reduced as compared to PV devices, where the absorber layer is subjected to less aggressive $CdCl_2$ activation treatment conditions.

During the $CdCl_2$ activation treatment, the sacrificial layer 118 may dissolve into absorber layers 120a, 120b at a higher rate than the semiconductor window layer 116. This is due to: (1) the closer proximity of sacrificial layer 118 to the layer upon which the chlorine compound is applied, and (2) the sacrificial layer 118 being between the two absorber layers allowing its sulfur to diffuse from both its upper and lower surfaces into the adjoining absorber layers 120a, 120b. Because the sulfur in the sacrificial layer 118 is dissolved at a higher rate than that of the semiconductor window layer 116, the sulfur solubility limit of the absorber layers 120a, 120b is more quickly approached reducing the amount of sulfur that is fluxed from the semiconductor window layer 116 into the absorber layers 120a, 120b and allowing for the p-n junction to be maintained between the window layer 116 and the absorber layer 120.

Note that choosing the same material for sacrificial layer 118 as that of the semiconductor window layer 116 is preferable. This is because the sulfur solubility limit of the absorber layers 120a, 120b may be reached more quickly using the same material for both the window layer 116 and the sacrificial layer 118 than with using different materials. Nonetheless, the sacrificial layer 118 need not be of the same material as that of the window layer 116. The sacrificial layer 118 may be made of other materials that reduce sulfur fluxing in the window layer 116 during the $CdCl_2$ activation treatment of the absorber layers 120a, 120b.

Another advantage of providing sacrificial layer 118 in association with the absorber layers 120a, 120b is that the sulfur in the sacrificial layer 118 can also serve to improve the physical and electrical characteristics of the absorber layers 120a, 120b surface and grain defects in much the same way as Cl atoms from the $CdCl_2$ activation treatment improve the absorber layers 120a, 120b by reducing the presence of charge trapping defects. With less electron loss at grain and at surface interfaces, photo-conversion efficiency can increase.

As shown in FIG. 2B, after the $CdCl_2$ activation treatment, the sacrificial layer 118 may be completely fluxed into adjacent first absorber layer 120a and second absorber layer 120b to the extent that absorber layers 120a and 120b become one continuous absorber layer 220 containing sulfur. However, depending on the thickness of sacrificial layer 118 deposited on the absorber layer 120a and the $CdCl_2$ treatment conditions, there may be a thin portion of sacrificial layer 118 remaining between the absorber layers 120a, 120b after the $CdCl_2$ activation treatment.

It should be understood that thicknesses 116t, 120at, 118t, and 120bt (FIG. 1) can each be varied to obtain a desired final thickness of continuous absorber layer 220 and window layer 116. It should also be understood that these layer thicknesses may also be varied based on the chosen $CdCl_2$ activation treatment parameters to obtain a single continuous absorber layer 220. For example, after a desired final continuous absorber layer 220 thickness and material is chosen, the $CdCl_2$ activation treatment conditions may then be determined to optimize the grain growth and defect repair of the absorber layers 120a and 120b (FIG. 1) in a manner that will form continuous absorber layer 220.

The $CdCl_2$ activation treatment conditions when using sacrificial layer 118 are not as restrictive as when forming a conventional PV device without sacrificial layer 118. A thicker sacrificial layer 118 may be required for higher $CdCl_2$ concentrations, longer annealing times, and higher temperatures. The distance of the sacrificial layer 118 from the surface of absorber layer 120b which receives the $CdCl_2$ treatment is determined by second absorber layer 120b thickness 120bt and can be varied independently of the sacrificial layer thickness 118t based on the $CdCl_2$ activation treatment conditions. For example, 120bt can be varied based on a chosen final continuous absorber layer 220 thickness by varying the relative thicknesses 120at, 120bt of absorber layers 120a, 120b, respectively. Choosing a thinner thickness 120bt would place the sacrificial layer 118 closer to the source of $CdCl_2$ and heat application causing the sulfur material in sacrificial layer 118 to flux at a higher rate as compared to using a thicker thickness 120bt.

An example of a more aggressive activation treatment, which may be realized by use of sacrificial layer 118, is provided in the following example. $CdCl_2$ is applied (FIG. 2) over the absorber layer 120b as an aqueous solution having a concentration of about 100-600 g/L, which can be 2-4 times more concentrated than in a conventional $CdCl_2$ activation. Other forms of $CdCl_2$ treatment may also be used, such as $CdCl_2$ vapor at ambient pressures. Further, the anneal temperature can be up to about 700° C., which is 280-300 degrees hotter than typically used.

The $CdCl_2$ activation treatment may include a single pass or a multiple pass anneal, meaning more than one heating step. One example of a multiple pass anneal employs a first heating of the $CdCl_2$ treated absorber layers 120a, 120b to about 450° C. for about 15 minutes and a second heating to about 450° C. for about 15 minutes. A second example of a multiple pass anneal employs a first heating to about 450° C. for about 15 minutes and a second heating to about 430° C. for about 20 minutes. A third example of a multiple pass anneal employs a first heating to about 430° C. for about 30 minutes and a second heating to about 430° C. for about 30 minutes. It is possible that, during or prior to the second heating steps just described, additional CdCl₂ can be applied to the absorber layers 120a, 120b, if desired.

During the CdCl₂ treatment, PV device 100 can be annealed at a temperature above about 200° C., for example, in a range of about 200° C. to about 700° C., about 300° C. to about 600° C., about 350° C. to about 500° C., about 400° C. to about 450° C., about 420° C. to about 450° C.

The annealing can be continued for as long as is needed to cause the sacrificial layer 118 to be partially or completely fluxed into adjacent absorber layers 120a, 120b resulting in the formation of continuous or mostly continuous absorber layer 220. A mostly continuous absorber layer 220 may result, for example, if not all of sacrificial layer 118 is fluxed into absorber layers 120a, 120b. PV device 100 can be heated for more than about 10 seconds, for example, in a range of about 10 seconds to about 2 hours, about 10 minutes to about 60 minutes, or about 15 minutes to about 30 minutes. The anneal times and temperatures of each or either of the annealing conditions can be adjusted independently or together to achieve continuous absorber layer 220.

Figure 3A:
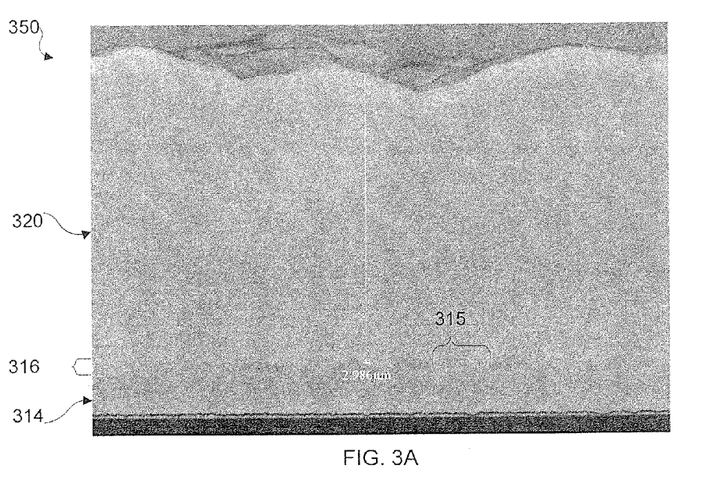
FIGS. 3A and 3B show a scanning electron microscope image of a side view of an example intermediate photovoltaic device and an intermediate photovoltaic device in accordance with a disclosed embodiment.
Figure 3B:
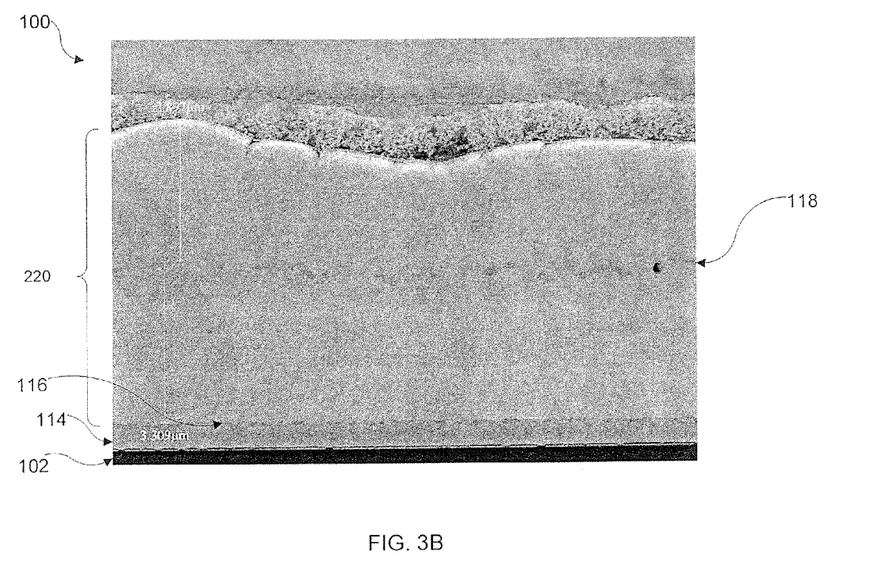

FIGS. 3A and 3B respectively show scanning electron microscope images of a cross section of a conventional PV device 350 formed without a sacrificial layer 118 (FIG. 3A) and PV device 100 formed with a sacrificial layer 118 (FIG. 3B) which have had a CdCl₂ annealing treatment under the same conditions. The PV device 350 was initially formed with a 450 Å CdS window layer 316 thickness and a 33,000 Å CdTe absorber layer 320 thickness. The PV device 100 was formed with a 450 Å CdS window layer 116, a 33,000 Å CdTe first absorber layer, a 450 Å CdS sacrificial layer 118, and a 33,000 Å CdTe second absorber layer. Both devices 350 and 100 underwent the same CdCl₂ activation treatment. A 200 g/l CdCl₂ solution was sprayed and spun on to each of PV devices 350 and 100 and both devices were heated to 430° C. for 20 minutes. The CdCl₂ solution was applied a second time and the PV devices 350 and 100 were heated for a second time to 430° C. for 20 minutes. As shown in FIG. 3A, the CdCl₂ activation treatment led to the formation of gaps 315 in the semiconductor window layer 316. The gaps 315 result in the shorting of the semiconductor absorber layer 320 to the TCO layer 314 contributing to the degradation of the absorber/window p-n junction. Now referring to FIG. 3B, PV device 100 shows a mostly continuous absorber layer 220 with some residual portions of sacrificial layer 118 not fully dissolved into absorber layer 220. FIG. 3B also shows PV device 100 with an improvement in window layer 116 continuity as compared to the gaps 315 in the window layer 316 of the PV device 350 of FIG. 3A.

Figure 4:
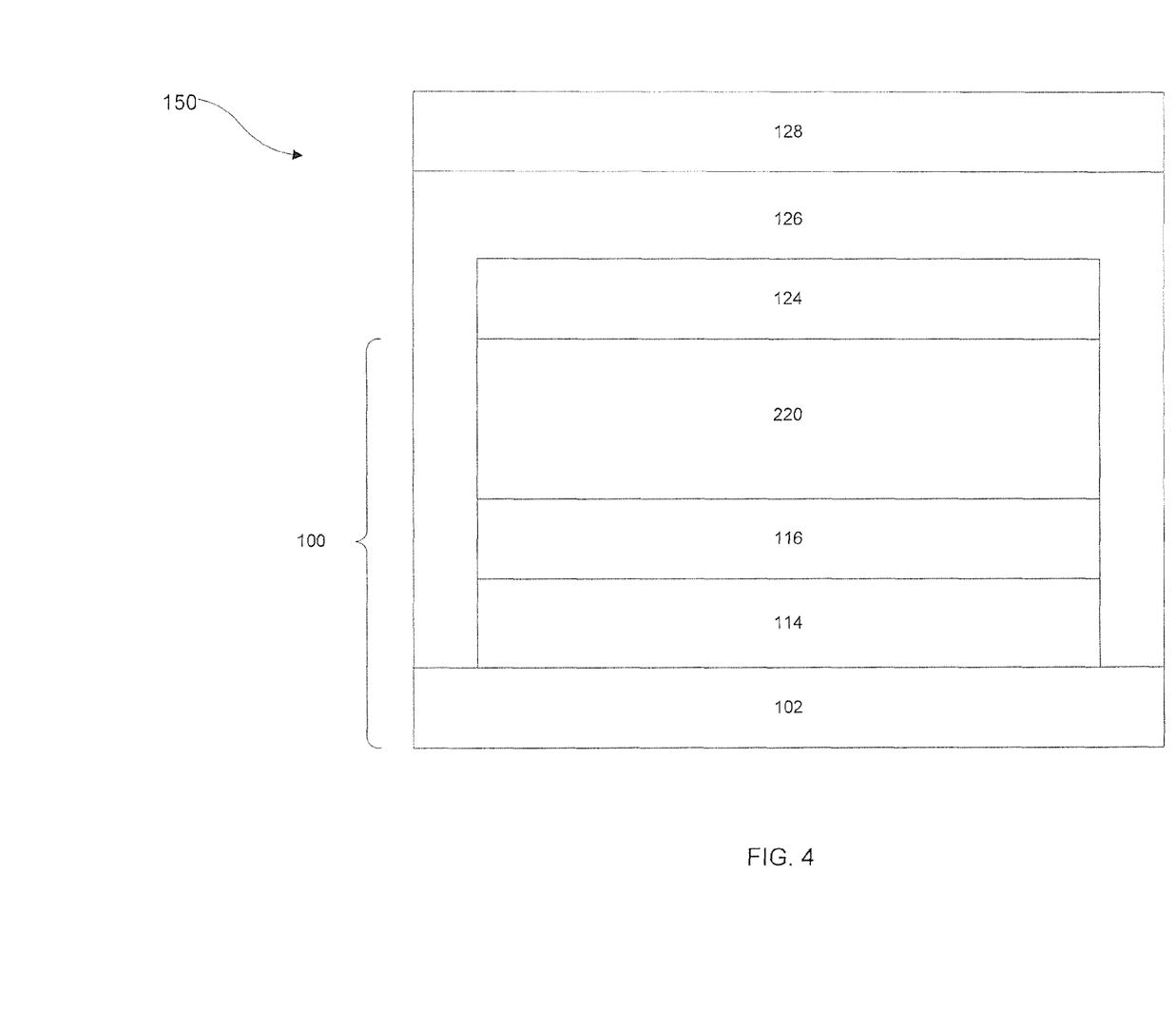
FIG. 4 shows a side view of a photovoltaic device in accordance with a disclosed embodiment.

Referring to FIG. 4, after the CdCl₂ activation treatment (FIGS. 2 and 3), a back contact layer 124 may be formed over the continuous or mostly continuous absorber layer 220. The back contact layer 124 does not have a transparency requirement and thus may be made of a metal such as Mo, Al, Cu, Ag, Au, or a combination thereof. After the formation of the back contact layer 124, a polymer interlayer 126 may be formed before affixing a back cover 128 to form a completed PV device 150. The interlayer 126 may be provided over the back contact layer 124 and sides of the layers (114, 116, 220, and 124) of the PV device 150 of FIG. 1 or PV device 100 of FIG. 4. It is used to supplement bonding between the different layers of the device 150 and to inhibit ingress of water or other contaminants into the device. It may be made of a polymer such as ethylene-vinyl acetate.

PV devices formed with sacrificial layers 118 have been found to have a higher photo-conversion efficiency than PV devices formed without sacrificial layers 118 due to the increased continuity of the p-n junction, the more aggressive CdCl₂ activation treatment conditions, and the addition of sulfur into the absorber layer 220 to passivate defects. The presence of sulfur in a CdTe absorber layer produces an absorber layer 220 having a $CdS_xTe_{1-x}$ structure, at least at areas of absorber layers 120a, 120b which were most adjacent sacrificial layer 118, where $CdS_xTe_{1-x}$ is an alloy of cadmium (Cd), sulfur (S), and tellurium (Te), and where x is greater than zero and less than one and represents the atomic ratio of sulfur to tellurium in the alloy material.

The embodiments described above are offered by way of illustration and example. Each layer in PV device 100 or 150 may, in turn, include more than one layer or film. Additionally, each layer can cover all or a portion of the device 100 or 150 and/or all or a portion of the layer or substrate underlying the layer. For example, a "layer" can include any amount of any material that contacts all or a portion of a surface.

It should be understood that the examples provided above may be altered in certain respects and still remain within the scope of the claims. It should be appreciated that, while the invention has been described with reference to the above preferred embodiments, other embodiments are within the scope of the claims.

What is claimed as new and desired to be protected by Letters Patent of the United States is:

1. A method of manufacturing a photovoltaic device, the method comprising:
   forming a first electrode;
   forming a window layer containing sulfur in electrical association with the first electrode;
   forming a first absorber layer adjacent the window layer;
   forming a sacrificial layer containing sulfur adjacent the first absorber layer;
   forming a second absorber layer adjacent the sacrificial layer;
   wherein the sacrificial layer is formed in contact with the first absorber layer and the second absorber layer;
   heating the device layers such that at least a portion of the sulfur from the sacrificial layer fluxes into the first and second absorber layers; and,
   forming a second electrode in electrical association with the second absorber layer.

2. The method of claim 1 wherein the fluxing of the sacrificial layer into the absorber layers decreases a fluxing of the sulfur from the window layer into the first absorber layer during the heating.

3. The method of claim 1, wherein the window layer and the sacrificial layer are formed of the same material.

4. The method of claim 1, wherein the window layer comprises a material selected from the group consisting of cadmium sulfide and cadmium zinc sulfide.

5. The method of claim 4, wherein the sacrificial layer comprises a material selected from the group consisting of cadmium sulfide and cadmium zinc sulfide.

6. The method of claim 1, wherein the first and second absorber layers each comprise cadmium telluride.

7. The method of claim 1, further comprising treating at least the second absorber layer with a compound comprising chlorine in association with the heating.

8. The method of claim 7, wherein the sacrificial layer and the first and second absorber layers are formed to thicknesses such that after the treating and heating steps at least a portion of the first and second absorber layers are in contact with each other.

9. The method of claim 7, wherein the sacrificial layer and first and second absorber layers are formed to thicknesses such that after the treating and heating steps a portion of each of the first and second absorber layers are separated by a portion of the sacrificial layer.

10. The method of claim 7 wherein the compound comprising chlorine comprises a material selected from the group consisting of $CdCl_2$, $NH_2Cl$, $ZnCl_2$, and $TeCl_4$.

11. The method of claim 10 wherein, wherein heating the device layers comprises a first heating at a first temperature and a second heating at a second temperature.

12. The method of claim 11, wherein the first and second temperatures are different.

13. The method of claim 10, wherein the treating step comprises more than one treatment step with the compound comprising chlorine.

14. The method of claim 13, wherein the heating steps comprise a first heating to between about 400° C. and about 600° C. for between about 10 seconds and about 2 hours after a first compound comprising chlorine treatment and a second heating to between about 400° C. and about 600° C. for between about 10 seconds and about 2 hours after a second compound comprising chlorine treatment step.

15. The method of claim 14, wherein the first and second heating steps are each to between about 420° C. and about 450° C. for between about 15 minutes and about 30 minutes.

16. The method of claim 7, wherein the compound comprising chlorine comprises an aqueous $CdCl_2$ solution having a concentration between about 100 g/L and about 600 g/L.

17. The method of claim 1, wherein the sacrificial layer is formed to a thickness of between about 50 Å and about 1000 Å.

18. The method of claim 17, wherein the first absorber layer is formed to a thickness of between about 10 Å and about 50,000 Å.

19. The method of claim 17, wherein the second absorber layer is formed to a thickness of between about 500 Å and about 50,000 Å.

20. The method of claim 17, wherein the window layer is formed to a thickness of between about 50 Å and about 2,000 Å.

21. The method of claim 17, wherein the sacrificial layer is formed to a thickness of between about 100 Å and about 800 Å.

22. The method of claim 21, wherein the first absorber layer is formed to a thickness of between about 10,000 Å and about 30,000 Å.

23. The method of claim 21, wherein the second absorber layer is formed to a thickness of between about 10,000 Å and about 40,000 Å.

24. The method of claim 21, wherein the window layer is formed to a thickness of between about 75 Å and about 1000 Å.

25. The method of claim 1, wherein heating the device layers comprises heating the device to between about 300° C. and about 600° C.

26. The method of claim 25, wherein heating the device layers comprises heating the device to between about 400° C. and about 450° C.

* * * * *